US006177842B1

United States Patent
Ahn et al.

(10) Patent No.: US 6,177,842 B1
(45) Date of Patent: Jan. 23, 2001

(54) STABILIZED PHASE LOCK DETECTION CIRCUITS AND METHODS OF OPERATION THEREFOR

(75) Inventors: Tae-won Ahn; Kyung-suc Nah, both of Seoul (KR)

(73) Assignee: Samsung Electronics Co., Ltd. (KR)

( * ) Notice: Under 35 U.S.C. 154(b), the term of this patent shall be extended for 0 days.

(21) Appl. No.: 09/170,938

(22) Filed: Oct. 13, 1998

(30) Foreign Application Priority Data

Oct. 13, 1997 (KR) .................................................. 97-52345

(51) Int. Cl.[7] .................................................. H03L 7/095
(52) U.S. Cl. .................................. 331/1 A; 331/DIG. 2; 331/25; 327/156; 327/159
(58) Field of Search .............................. 331/DIG. 2, 1 A, 331/25; 327/156, 159

(56) References Cited

U.S. PATENT DOCUMENTS

| 3,893,042 | 7/1975 | Whitman et al. ................ 331/55 |
| 3,956,710 | 5/1976 | Seitz et al. ...................... 331/1 A |
| 3,988,696 | 10/1976 | Sharpe .............................. 331/1 A |
| 4,122,405 | 10/1978 | Tietz et al. ....................... 331/1 A |
| 5,126,690 | * 6/1992 | Bui et al. ......................... 331/1 A |
| 5,128,632 | 7/1992 | Erhart et al. ..................... 331/1 A |
| 5,189,379 | 2/1993 | Saito et al. ...................... 331/1 A |
| 5,278,520 | 1/1994 | Parker et al. .................... 331/1 A |
| 5,724,007 | 3/1998 | Mar .................................. 331/1 A |
| 5,822,387 | 10/1998 | Mar .................................. 375/376 |
| 5,886,582 | * 3/1999 | Stansell ........................... 331/1 A |

* cited by examiner

*Primary Examiner*—Arnold Kinkead
(74) *Attorney, Agent, or Firm*—Myers Bigel Sibley & Sajovec

(57) ABSTRACT

A phase lock detection circuit includes a phase detection circuit that produces a phase detect signal having one of a first logic state or a second logic state responsive to a first input signal and a second input signal applied thereto. A stabilized phase lock indication circuit is electrically coupled to the phase detection circuit and produces a phase lock indication signal having one of a first logic state or a second logic state, the phase lock indication signal changing to a respective one of its first and second logic states in response to the phase detect signal remaining in a respective one of its first and second logic states for a predetermined time interval. In a first embodiment, the phase lock indication is controlled by monitoring a digital count. In a second embodiment, the phase lock indication signal is controlled by monitoring a capacitor voltage. Related operating methods are also discussed.

28 Claims, 7 Drawing Sheets

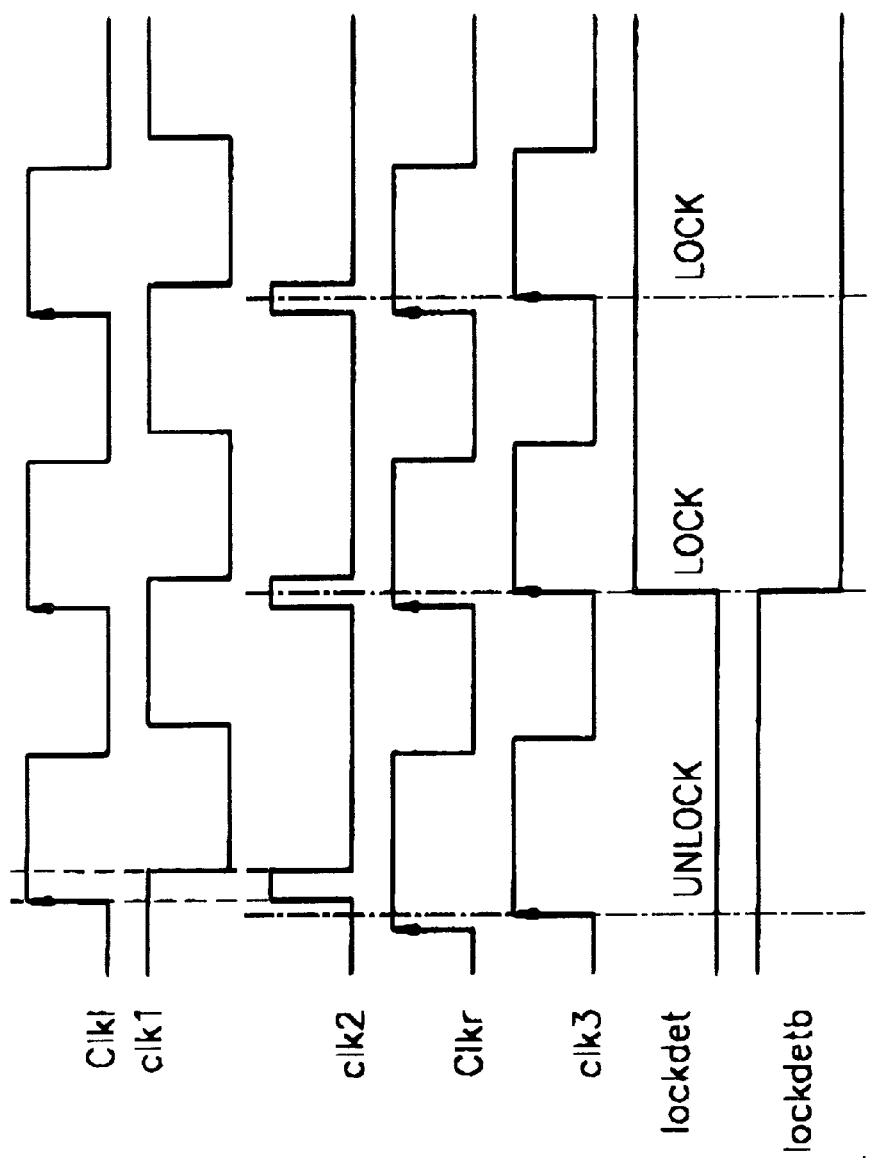

STABILIZED PHASE LOCK DETECTION CIRCUITS AND METHODS OF OPERATION THEREFOR

FIELD OF THE INVENTION

The present invention relates to phase detection circuits and methods of operation therefor, and more particularly, to phase lock detection circuits and methods of operation therefor.

BACKGROUND OF THE INVENTION

Phase lock loop (PLL) and other phase control circuits typically require a determination of when the circuit has achieved phase synchronization, i.e., "phase lock." It is generally desirable that this determination be made as accurately as possible in order to meet system performance requirements. In addition, a typical charge-pump type phase lock loop generates relatively large currents when in its acquisition mode, i.e., when it is seeking phase lock, and generates a relative smaller current when phase lock is achieved. Consequently, typical phase control systems attempt to quickly achieve phase lock and to maintain phase lock without oscillation in order to reduce power dissipation.

Towards this end, it is generally desirable in phase lock loops and other phase control circuits to accurately detect phase lock in a manner which is less susceptible to noise. It is also desirable to detect phase lock in a manner that is less prone to oscillation as the loop transitions in or out of phase lock.

SUMMARY OF THE INVENTION

In light of the foregoing, it is an object of the present invention to provide phase lock detection circuits and methods of operation therefor which can provide accurate and stable phase lock detection.

It is another object of the present invention to provide phase lock detection circuits and methods of operation therefor that have improved immunity to noise.

These and other objects, features and advantages are provided according to the present invention by phase lock detection circuits and methods of operation therefor in which a digital phase detection circuit produces a phase detect signal from first and second input signals provided thereto, and a stabilized phase lock detection circuit produces a phase lock indication signal responsive to the phase detect signal, the phase lock indication signal changing to a respective one of its first and second logic states in response to the phase detect signal remaining in a respective one of its first and second logic states for a predetermined time interval.

The phase detection circuit preferably generates a window signal from the first input signal, the value of which is latched by a flip-flop circuit upon a transition of a delayed version of the second input signal to produce the phase detect signal. In this manner, a window detector is implemented that changes the phase detect signal to a logic state that indicates phase agreement when the second input signal has a phase delay with respect to the first input signal that falls within a time interval defined by the window signal.

The phase lock detection circuit may include a digital circuit that controls a digital count, the phase lock detection circuit changing the logic state of the phase lock detection signal when the digital count meets predetermined criteria. The predetermined criteria, e.g., a predetermined count threshold, may be programmably provided to the phase lock detection circuit. The phase lock detection circuit may alternatively include a circuit that controls a voltage across a capacitor, the phase lock detection circuit changing the logic state of the phase lock indication signal when the capacitor voltage meets predetermined criteria.

The present invention provides improved phase lock detection by utilizing circuitry that introduces hysteresis into the phase lock detection process. In this manner, oscillation or other instability caused by such factors as noise can be reduced and a more accurate indication of phase lock achieved.

In particular, according to the present invention, a phase lock detection circuit includes a phase detection circuit that produces a phase detect signal having one of a first logic state or a second logic state responsive to a first input signal and a second input signal applied thereto. A stabilized phase lock indication circuit is electrically coupled to the phase detection circuit and produces a phase lock indication signal having one of a first logic state or a second logic state, the phase lock indication signal changing to a respective one of its first and second logic states in response to the phase detect signal remaining in a respective one of its first and second logic states for a predetermined time interval.

The phase detection circuit may include a first delay circuit configured to receive the first input signal and operative to produce a delayed first input signal therefrom, and a logic gate electrically coupled to the first delay circuit and operative to produce a window signal at an output thereof, the window signal representing a logic ANDing of the first input signal and the delayed first input signal. A second delay circuit is configured to receive the second input signal and operative to produce a delayed second input signal therefrom. A flip-flop circuit is electrically coupled to the logic gate and to the second delay circuit, receiving the window signal at a data input thereof and receiving the delayed second input signal at a clock input thereof and producing a phase detect signal therefrom that has a logic state corresponding to the logic state of the window signal at a transition of the delayed second input signal.

The stabilized phase lock indication circuit may include means for increasing a value when the phase detect signal is in its first logic state and for decreasing the value when the phase detect signal is in its second logic state. Means may be provided for changing the phase lock indication signal to its first logic state when the value meets a first predetermined criterion and for changing the phase lock indication signal to its second logic state when the value meets a second predetermined criterion.

In a first embodiment according to the present invention, the stabilized phase lock indication circuit includes means for controlling a digital count responsive to the phase detect signal. Means are provided for changing the phase lock indication signal to its first logic state when the digital count meets a first predetermined criterion and for changing the phase lock indication signal to its second logic state when the digital count meets a second predetermined criterion. The means for controlling a digital count may include means for increasing the digital count when the phase detect signal is in its first logic state and for decreasing the digital count when the phase detect signal is in its second logic state. The means for changing the phase lock indication signal may include means for changing the phase lock indication signal to its first logic state when the digital count increases above a predetermined threshold and means for changing the phase lock indication signal to its second logic state when the digital count decreases below the predetermined threshold.

In a second embodiment according to the present invention, the stabilized phase lock indication circuit includes a capacitor and means for controlling a capacitor voltage across the capacitor responsive to the phase detect signal. Means are provided for changing the phase lock indication signal to its first logic state when the capacitor voltage meets a first predetermined criterion and for changing the phase lock indication signal to its second logic state when the capacitor voltage meets a second predetermined criterion.

The means for controlling a capacitor voltage may include means for charging the capacitor to increase the capacitor voltage when the phase detect signal is in its first logic state and for discharging the capacitor to decrease the capacitor voltage when the phase detect signal is in its second logic state. The means for changing the phase lock indication signal may include means for changing the phase lock indication signal to its first logic state when the capacitor voltage rises above a first predetermined threshold and for changing the phase lock indication signal to its second logic state when the capacitor voltage falls below a second predetermined threshold.

Related operating methods are also discussed.

BRIEF DESCRIPTION OF THE DRAWINGS

FIG. 2B is a timing diagram illustrating exemplary operations for the circuit of FIG. 2A.

DETAILED DESCRIPTION OF EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As will be appreciated by one of skill in the art, the present invention may be embodied as methods or devices.

Figure 1:
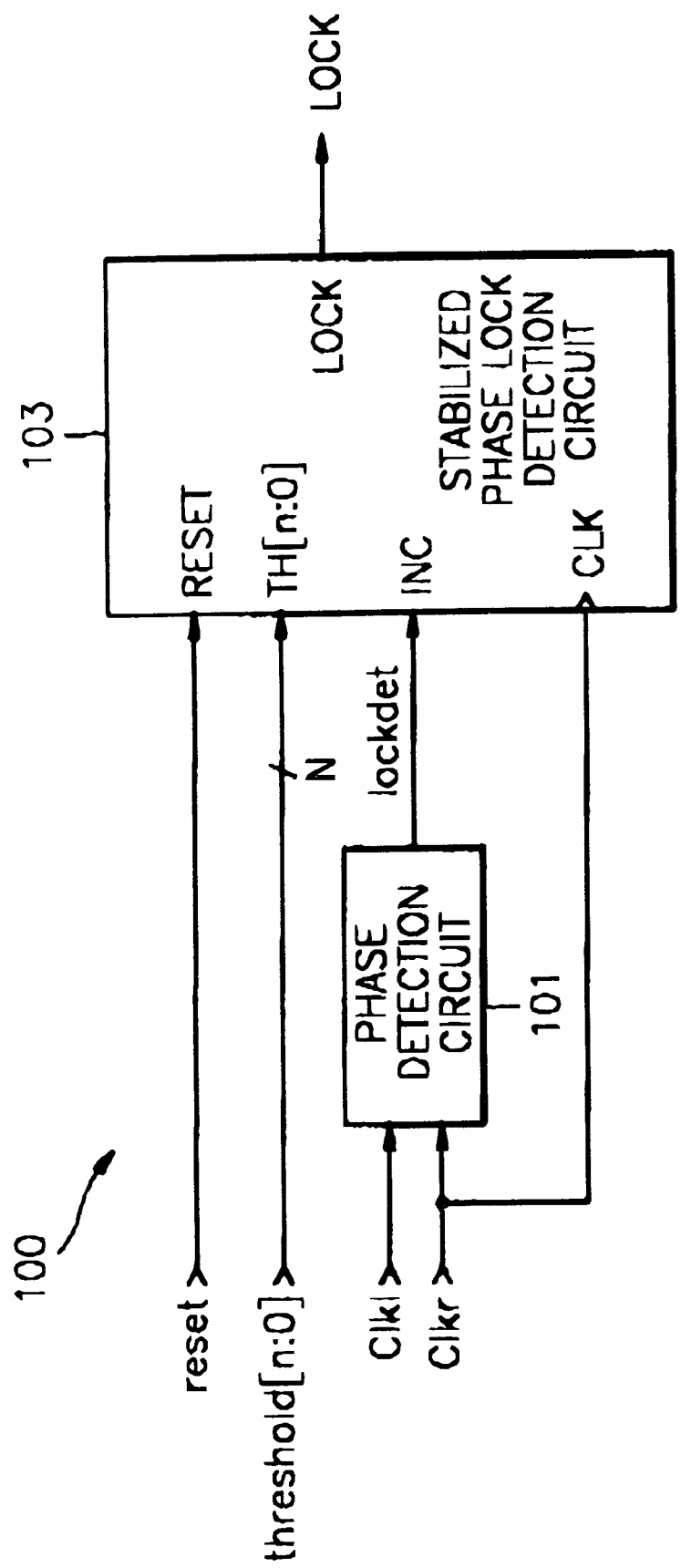
FIG. 1 is a schematic diagram illustrating an embodiment of a phase lock detection circuit according to the present invention.

Referring to FIG. 1, an embodiment of a phase lock detection circuit 100 includes a phase detection circuit 101 and a stabilized phase lock indication circuit 103. The phase detection circuit is configured to receive first and second input signals Clkl, Clkr, producing a phase detect signal lockdet therefrom that indicates whether the phases of the two input signals Clkl, Clkr are in agreement. For the illustrated embodiment, the phase detect signal lockdet takes on a "high" logic state when the phases of the first and second input signals Clkl, Clkr are in agreement and takes on a "low" logic state when the first and second input signals Clkl, Clkr are out of phase.

The stabilized phase lock indication circuit 103 controls a digital count responsive to the phase detect signal lockdet and the second input signal Clkr, and produces a phase lock indication signal LOCK based on the digital count. The stabilized phase lock indication circuit 103 increments or decrements the digital count responsive to the phase detect signal lockdet. The stabilized phase lock indication circuit 103 is also configured to receive a predetermined threshold threshold[n:0] at a threshold input TH[n:0], as well as a reset signal reset at a reset input RESET. The stabilized phase lock indication circuit 103 generates the phase lock indication signal LOCK based on a comparison of the digital count with the predetermined threshold threshold[n:0], as explained in greater detail below.

Figure 2A:
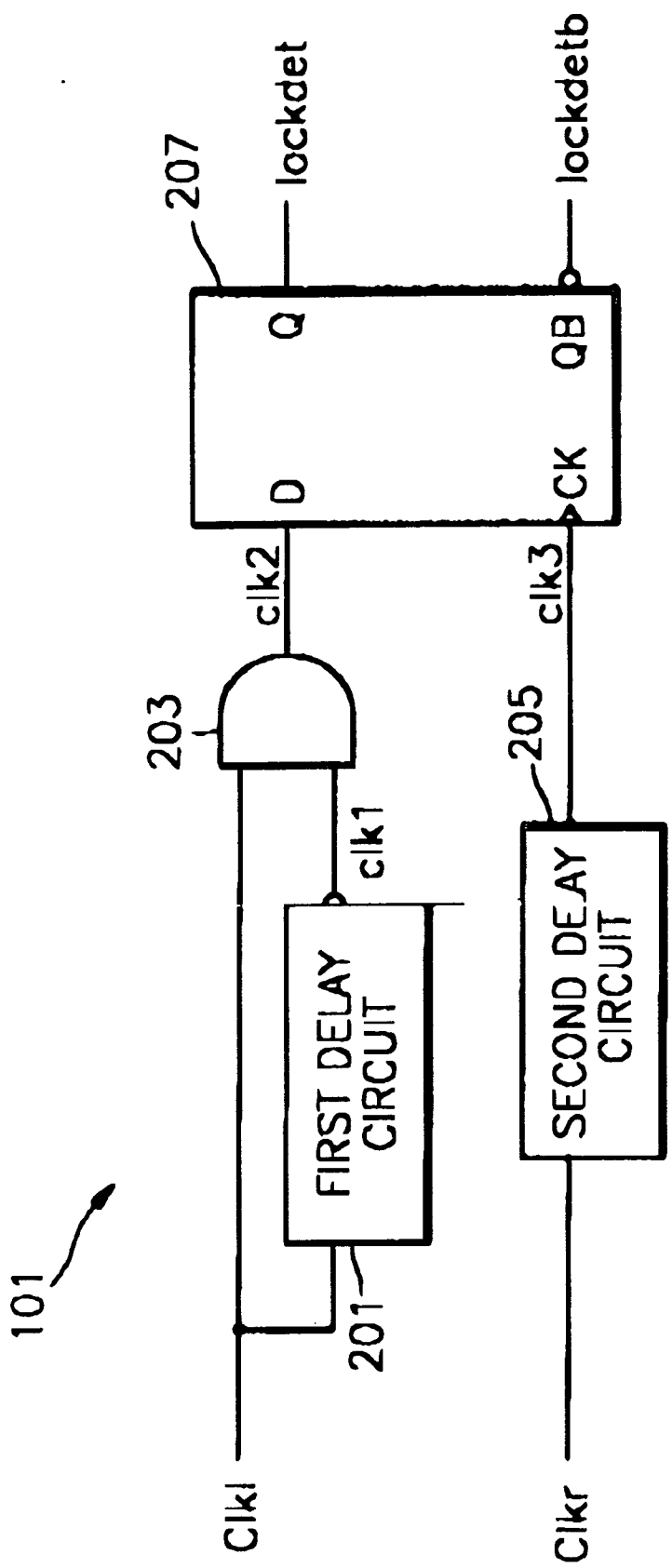
FIG. 2A is a schematic diagram illustrating an embodiment of a phase detection circuit for the circuit of FIG. 1.

Referring to FIG. 2A, an embodiment of a phase detection circuit 101 includes a first delay circuit 201 that produces a delayed first input signal clk1 from the first input signal Clkl. The delayed second input signal clk1 is then logically AND'ed with the first input signal Clkl to produce a window signal clk2. A second delay circuit 205 produces a delayed second input signal clk3 from the second input signal Clkr. The window signal clk2 is applied to the data input D of a flip-flop circuit 207, which is clocked by the delayed second input signal clk3 that is applied to its clock input CK. The data outputs Q, QB of the flip-flop circuit 207 produce complementary signals lockdet, lockdetb that depend upon the logic state of the window signal clk2 upon transition of the delayed second input signal Clkr.

This is illustrated more explicitly in FIG. 2B. Assuming that the first and second input signals Clkl, Clkr are clock signals, the window signal clk2 produced by the logic ANDing of the first input signal Clkl and the delayed first input signal clk1 comprises a pulse signal, with the positive pulses of the window signal clk2 occurring during time windows defined by the rising edge of the first input signal Clkl and the falling edge of the delayed first input signal clk1. The delayed second input signal clk3 preferably is delayed with respect to the second input signal Clkr by a delay which is approximately half of the delay of the delayed first input signal clk1 with respect to the first input signal Clkl, i.e., by a delay half as long as the time windows defined by the window signal clk2.

As illustrated, when the rising edge of the delayed second input signal clk3 falls within one of the time windows defined by the window signal clk2, the phase detect signal lockdet changes to a "high" logic state, indicating phase agreement between the first input signal Clkl and the second input signal Clkr. When the rising edge of the delayed second input signal clk3 falls outside of the window, however, the phase detect signal lockdet takes on a logic "low" state, indicating lack of phase agreement. The complementary phase detect signal lockdetb takes on logic states complementary to those of the phase detect signal lockdet.

Figure 3:
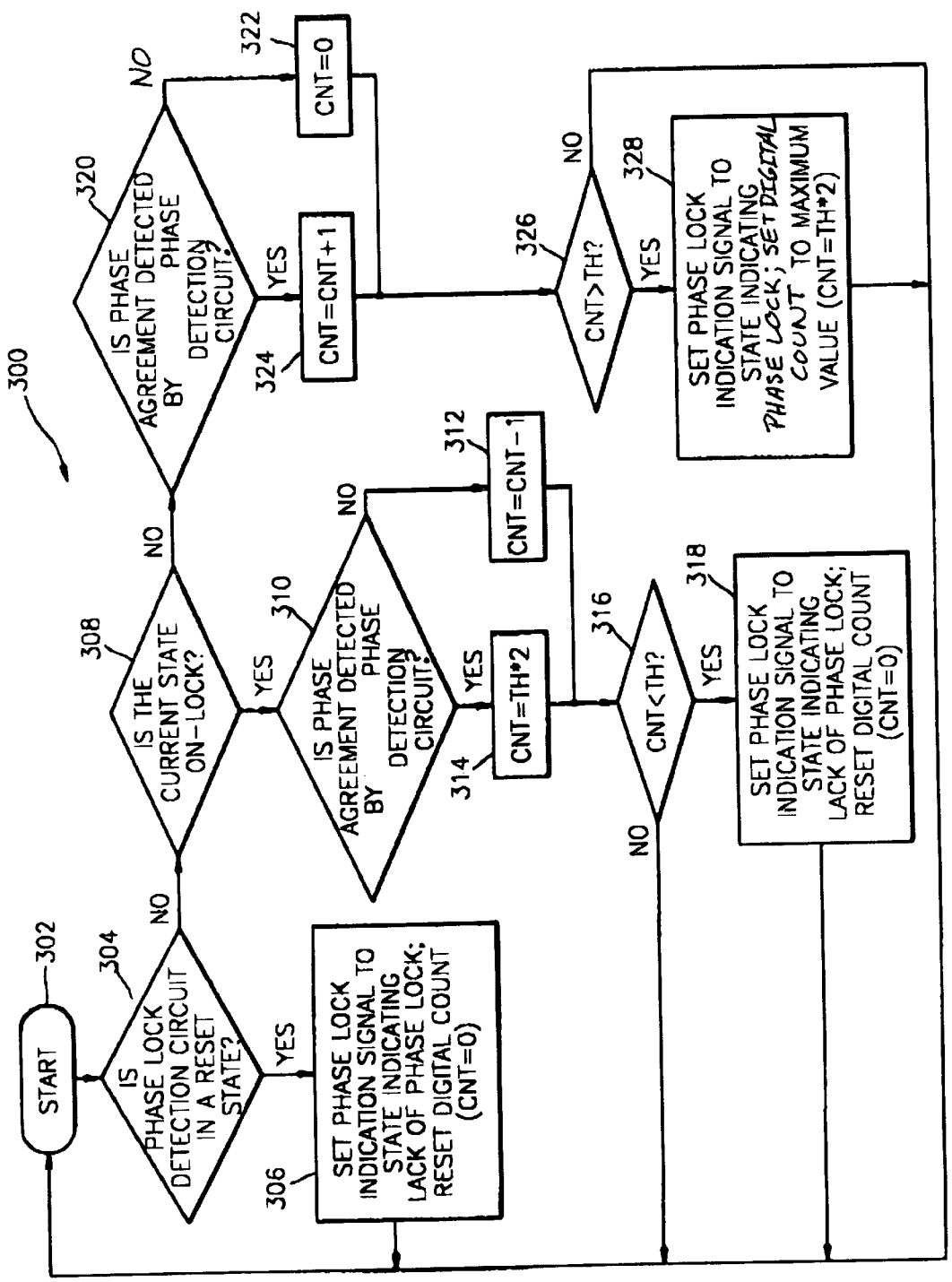
FIG. 3 is a flowchart illustration of exemplary operations for detecting phase lock according to an aspect of the present invention.
Figure 4:
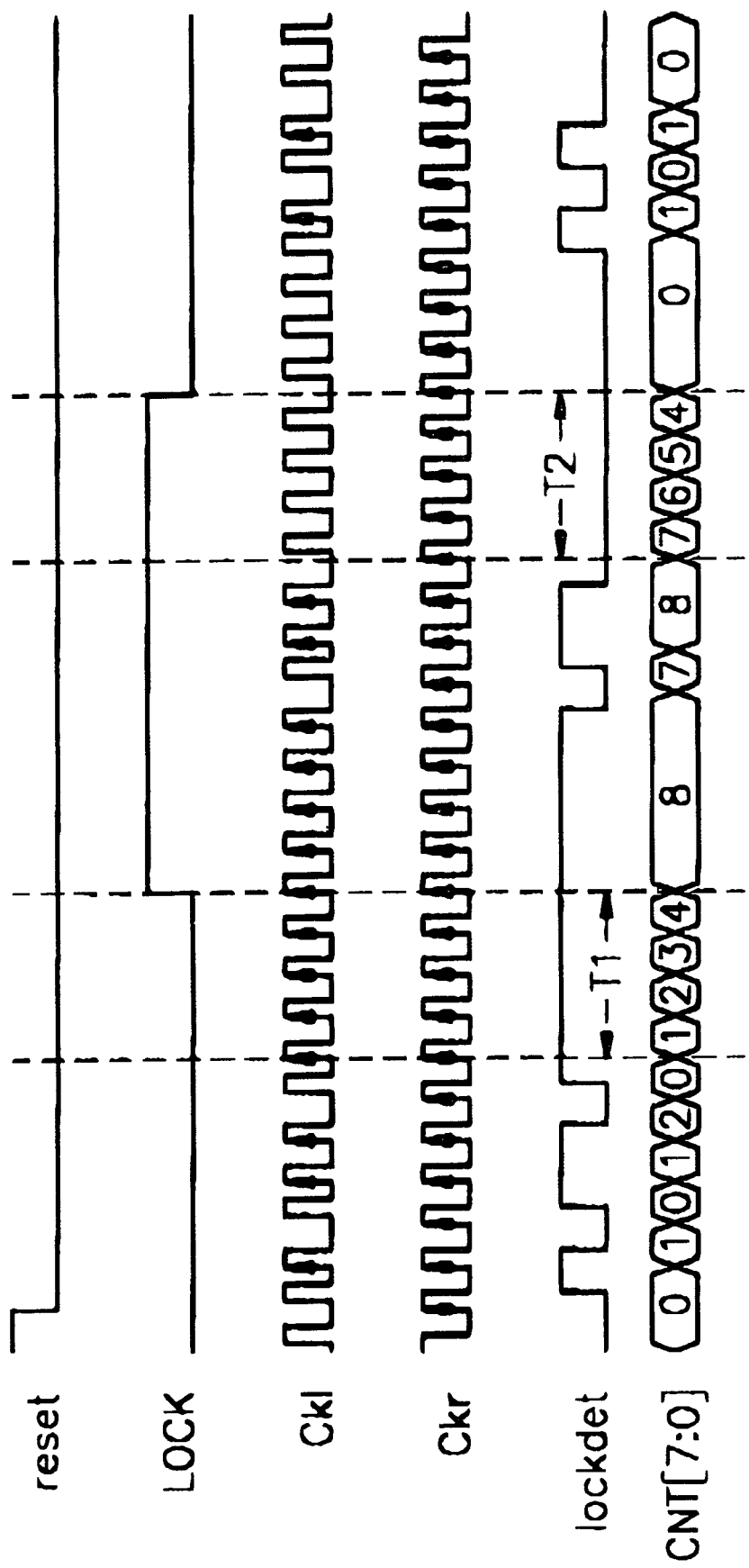
FIG. 4 is a timing diagram illustrating exemplary operations for the circuit of FIG. 1.

FIGS. 3 and 4 illustrate exemplary operations 300 for the phase lock detection circuit 100 of FIG. 1. Upon a rising edge of the second input signal Clkr (Block 302), the phase lock detection circuit 100 determines whether it is in a reset state (Block 304). If the circuit is reset, e.g., if the reset signal reset of FIG. 1 is currently asserted, the circuit initializes the digital count CNT[7:0] to zero and generates a phase lock indication signal LOCK having a logic state that indicates lack of phase lock (Block 306), and then awaits the next rising edge of the second input signal Clkr (Block 302).

If the phase lock indication circuit is not in the reset state, the circuit next determines if it currently is in an "on-lock" state, i.e., if the current logic state of the phase lock indication signal LOCK indicates phase lock (Block 308). If it does, the phase lock detection circuit next determines if the phase detect signal lockdet indicates phase agreement (Block 310). If it does, the digital count CNT[7:0] is set to twice a threshold value (Block 314). If not, the digital count CNT[7:0] is decremented (Block 312).

The digital count CNT[7:0] is then compared to the threshold value, here shown as being equal to four (4)(Block 316). If the count is less than the threshold value, the phase lock indication circuit changes the state of the phase lock indication signal LOCK to indicate lack of phase lock and resets the digital count CNT[7:0] to zero (Block 318). Otherwise, the circuit maintains the phase lock indication signal LOCK in a state that indicates phase lock. The circuit then awaits the next rising edge of the second input signal Clkr (Block 302).

If the test of the current circuit status (Block 308) indicates that the circuit is in an "off-lock" state, i.e., if the current state of the phase lock indication signal LOCK indicates lack of phase lock, the circuit determines if the phase detect signal lockdet indicates phase agreement (Block 320). If it does, the digital count CNT[7:0] is incremented (Block 324). If not, the digital count CNT[7:0] is reset to zero (Block 322)

The digital count CNT[7:0] is then compared to the threshold value (Block 326). If the count is greater than the threshold value, the phase lock indication circuit changes the logic state of the phase lock indication signal LOCK to indicate phase lock and sets the digital count CNT[7:0] to twice the threshold value (Block 328). Otherwise, the circuit maintains the phase lock indication signal LOCK in a logic state indicating lack of phase lock. The circuit then awaits the next rising edge of the second input signal Clkr (Block 302).

Referring to FIG. 4, the phase lock detection circuit of FIG. 1 operates such that when the phase detect signal lockdet has continuously remained in a "high" logic state for a first time interval T1, the phase lock indication signal LOCK is changed to a "high" logic state, indicating phase lock. When the phase detect signal lockdet has remained in a "low" logic state for a second time interval T2, the phase lock indication signal LOCK is changed to a "low" logic state to indicate lack of phase lock.

Those skilled in the art will appreciate that the circuits of FIGS. 1 and 2A may be implemented in a number of different ways using a number of different devices. For example, the phase detection circuit 101 and the stabilized phase lock indication circuit 103 may be implemented using a number of different types of devices, including discrete logic gates and counters, programmable logic devices (PLDs), application specific integrated circuits (ASICs) and the like. Those skilled in the art will also appreciate that logic architecture of these circuits may also be varied to encompass logically complementary implementations; for example, the control of the digital counter may be implemented such that the digital count decrements when the phase detect signal lockdet indicates phase agreement and increments when the phase detect signal indicates lack of phase agreement, with the reset and set functions for the count defined in Blocks 304, 318 and 328 being suitably replaced with complementary operations.

It will also be understood that the operations of FIGS. 3 and 4 may also be varied within the scope of the present invention. For example, the many of the operations 300 of FIG. 3 which are shown implemented in a serial fashion may also be performed concurrently. For example, the tests indicated in Blocks 304, 308, 310, and 320 may be implemented as concurrent state transition criteria in a state machine embodied in a programmable logic device (PLD) or similar circuitry. In addition, although the illustrated embodiment implements symmetrical first and second time intervals T1, T2, those skilled in the art will appreciate that variation of the threshold value CNT[7:0] supplied to the phase lock indication circuit 103 may result in asymmetrical time intervals.

Figure 5:
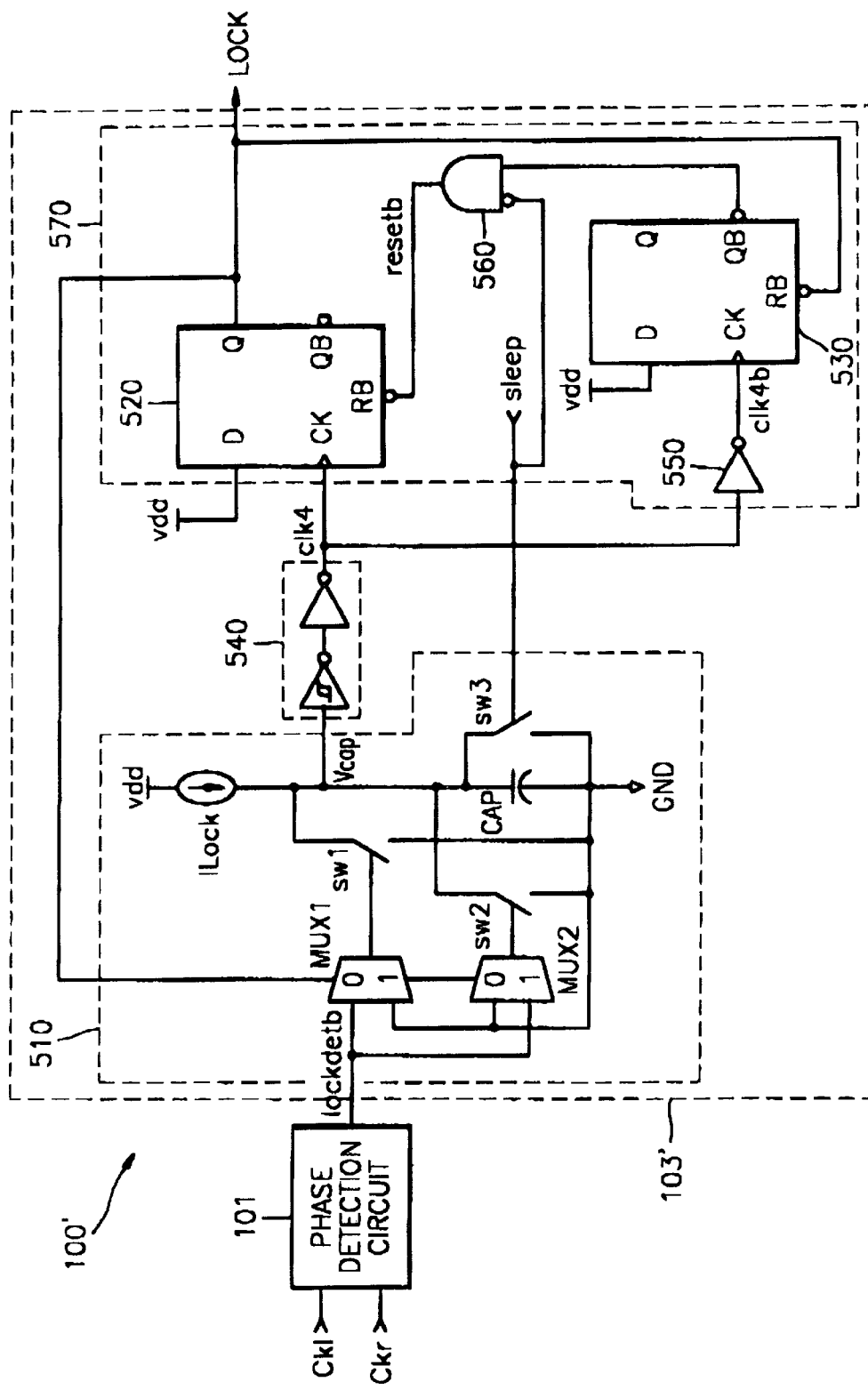
FIG. 5 is a schematic diagram illustrating another embodiment of a phase lock detection circuit according to the present invention.

FIG. 5 illustrates another embodiment of a phase lock detection circuit 100' according to the present invention. The phase lock detection circuit 100' includes a phase detection circuit 101 such as that illustrated in FIGS. 1 and 2A, but includes a stabilized phase lock indication circuit 103' that controls a capacitor voltage Vcap across a capacitor CAP in lieu of a digital count.

A capacitor charging circuit 510 provides means for controlling the voltage across the capacitor CAP responsive to the phase detect signal lockdetb generated by the phase detection circuit 101. The capacitor charging circuit 510 includes a current source ILock that supplies current from a power supply bus vdd to a first terminal of the capacitor CAP. A ground signal GND is applied to a second terminal of the capacitor CAP. First and second multiplexers MUX1, MUX2 which selectively apply the ground signal GND and the phase detect signal lockdetb to first and second switches sw1, sw2 that are operative to discharge the capacitor CAP when in their closed states and that provide a high impedance at the second terminal of the capacitor CAP when in their open states. The first terminal of the capacitor is also connected to a third switch sw3 that is operative to apply the ground signal GND to the capacitor CAP responsive to a sleep input signal sleep, thus discharging the capacitor when the sleep input signal sleep is asserted. The first terminal of the capacitor CAP is also connected to a threshold buffer circuit 540 that produces a logic signal clk4 responsive to the capacitor voltage Vcap. The buffer 540 introduces hysteresis into the logic signal clk4, e.g., the logic signal clk4 produced by the buffer 540 changes from a logic "low" to a logic "high" when the capacitor voltage Vcap increases past a first threshold voltage, and changes from a logic "high" to a logic "low" when the capacitor voltage Vcap decreases below a second threshold voltage that is less than the first threshold voltage.

A latching circuit 570 produces the phase lock indication signal LOCK responsive to the logic signal clk4. The latching circuit 570 includes first and second flip-flop circuits 520, 530. The logic signal clk4 is applied directly to the clock input CK of the first flip-flop circuit 520. The logic signal clk4 is also applied to an inverter 550, producing an inverted logic signal clk4b that is applied to the clock input CK of the second flip-flop circuit 530. The power supply bus voltage vdd is applied to the data inputs D of both of the first and second flip-flop circuits 520, 530. The phase lock indication signal LOCK produced at the data output Q of the first flip-flop circuit 520 is applied to the reset input RB of the second flip-flop circuit 530, and a signal produced at the complementary output QB of the second flip-flop circuit 530 is logically AND'ed with an inverted version of the sleep input signal sleep in a logic gate 560 to produce a reset signal resetb that is applied to the reset input RB of the first flip-flop circuit 520.

Figure 6:
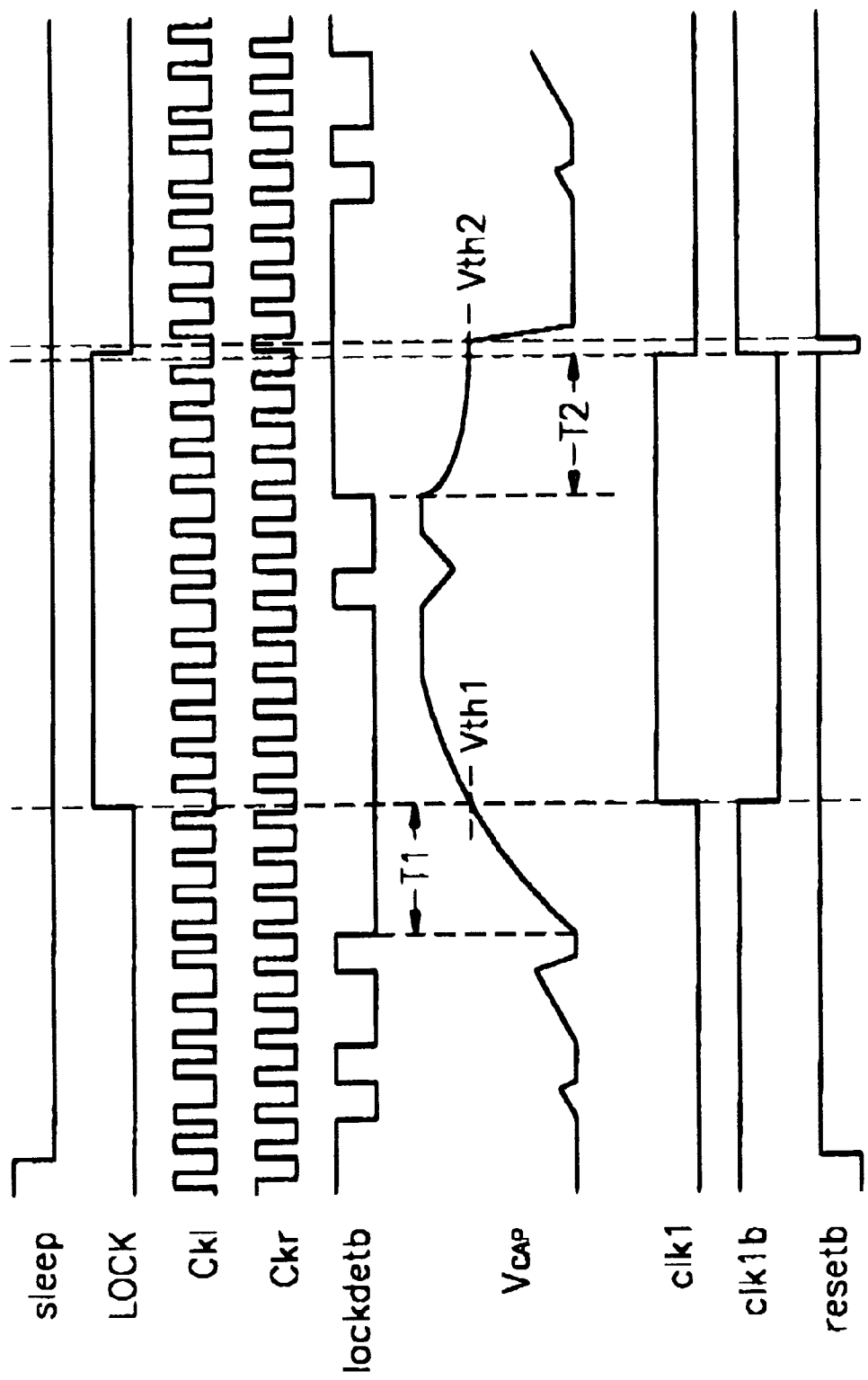
FIG. 6 is a timing diagram illustrating exemplary operations for the circuit of FIG. 5.

Referring now to both FIGS. 5 and 6, the first multiplexer MUX1 applies the phase detect signal lockdetb to the first switch sw1 when the phase lock indication signal LOCK is in a logic "low" state, i.e., a state indicating lack of phase lock, while the second multiplexer applies the ground signal GND to the second switch sw2, holding the second switch sw2 open. When the phase detect signal lockdetb is "low," indicating phase agreement, the first switch sw1 is held open, allowing the voltage Vcap across the capacitor CAP to increase. When the phase detect signal lockdetb goes "high", the first switch sw1 closes, discharging the capacitor CAP and causing the capacitor voltage Vcap to decrease. If the phase detect signal lockdetb remains "low" for a sufficiently long time interval T1, however, the capacitor voltage Vcap increases past the first threshold voltage Vth1, causing the logic signal clk4 of the buffer 540 to change to a logic "high." In response, the phase lock indication signal LOCK is latched to a logic "high" value, indicating that phase lock has been achieved.

When the phase lock indication signal LOCK has a logic "high" value, the first multiplexer MUX1 applies the ground signal GND to the first switch sw1, holding the first switch sw1 open, while the second multiplexer MUX2 applies the phase detect signal lockdetb to the second switch sw2. When the phase detect signal lockdetb is in a logic "low" state, indicating phase agreement, the second switch sw2 is held open, allowing the capacitor CAP to charge and the capacitor voltage Vcap to increase. When the phase detect signal lockdetb goes "high," the second switch sw1 closes, causing the capacitor CAP to discharge and the capacitor voltage Vcap to decrease. If the phase detect signal lockdetb remains "high" for a sufficiently long time period T2, the capacitor voltage Vcap decreases below the second threshold voltage Vth2, causing the logic signal clk4 produced by the buffer 540 to change state to a logic "low." In response, the reset signal reset produced at the complementary data output QB of the second flip-flop circuit 530 goes "low," resetting the first flip-flop circuit 520 and sending the phase lock indication signal LOCK "low."

Preferably, the first switch sw1 discharges the capacitor CAP at a faster rate when closed that the second switch sw2 does when closed. This may be achieved, for example by using a first switch sw1 that has a smaller "on" resistance than the second switch sw2. The first and second time intervals T1, T2 can be given by:

$$T1 = \frac{C \times Vth1}{ILock}, \text{ and}$$

$$T2 = Rsw2 \times C \times \ln\left(\frac{vdd}{Vth2 - Rsw2 \times ILock}\right),$$

where Rsw2 is the on resistance of the second switch sw2, and C is the capacitance of the capacitor CAP.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A phase lock detection circuit, comprising:
   a phase detection circuit that produces a phase detect signal having one of a first logic state or a second logic state responsive to a first input signal and a second input signal applied thereto, said phase detection circuit comprising:
      a first delay circuit configured to receive the first input signal and operative to produce a delayed first input signal therefrom;
      a logic gate electrically coupled to said first delay circuit and operative to produce a window signal at an output thereof, the window signal representing a logic ANDing of the first input signal and the delayed first input signal;
      a second delay circuit configured to receive the second input signal and operative to produce a delayed second input signal therefrom; and
      a flip-flop circuit, electrically coupled to said logic gate and to said second delay circuit, said flip-flop circuit receiving the window signal at a data input thereof and receiving the delayed second input signal at a clock input thereof and producing a phase detect signal therefrom that has a logic state corresponding to the logic state of the window signal at a transition of the delayed second input signal; and
   a stabilized phase lock indication circuit, electrically coupled to said phase detection circuit, that produces a phase lock indication signal having one of a first logic state or a second logic state, the phase lock indication signal changing to a respective one of its first and second logic states in response to the phase detect signal remaining in a respective one of its first and second logic states for a predetermined time interval.

2. The phase lock detection circuit according to claim 1, wherein said first delay circuit produces a delayed first input signal that is delayed by a first delay with respect to the first input signal, and wherein said second delay signal produces a delayed second input signal that is delayed by half of the first delay with respect to said second input signal.

3. The phase lock detection circuit according to claim 2, wherein said stabilized phase lock indication circuit comprises:
   means for increasing a value when said phase detect signal is in its first logic state and for decreasing the value when said phase detect signal is in its second logic state; and
   means for changing the phase lock indication signal to its first logic state when the value meets a first predetermined criterion and for changing the phase lock indication signal to its second logic state when the value meets a second predetermined criterion.

4. A phase lock detection circuit, comprising:
   a phase detection circuit that produces a phase detect signal having one of a first logic state or a second logic state responsive to a first input signal and a second input signal applied thereto;
   a stabilized phase lock indication circuit, electrically coupled to said phase detection circuit, that produces a phase lock indication signal having one of a first logic state or a second logic state, the phase lock indication signal changing to a respective one of its first and second logic states in response to the phase detect signal remaining in a respective one of its first and second logic states for a predetermined time interval, said stabilized phase lock indication circuit including:
      means for controlling a digital count responsive to the phase detect signal, wherein said means for controlling a digital count comprises means for increasing the digital count when the phase detect signal is in its first logic state and for decreasing the digital count when the phase detect signal is in its second logic state; and
      means for changing the phase lock indication signal to its first logic state when the digital count meets a first predetermined criterion and for changing the phase lock indication signal to its second logic state when the digital count meets a second predetermined criterion.

5. A phase lock detection circuit, comprising:
   a phase detection circuit that produces a phase detect signal having one of a first logic state or a second logic state responsive to a first input signal and a second input signal applied thereto;
   a stabilized phase lock indication circuit, electrically coupled to said phase detection circuit, that produces a phase lock indication signal having one of a first logic state or a second logic state, the phase lock indication signal changing to a respective one of its first and second logic states in response to the phase detect signal remaining in a respective one of its first and second logic states for a predetermined time interval, said stabilized phase lock indication circuit including:
  means for controlling a digital count responsive to the phase detect signal; and
  means for changing the phase lock indication signal to its first logic state when the digital count meets a first predetermined criterion and for changing the phase lock indication signal to its second logic state when the digital count meets a second predetermined criterion, wherein said means for changing the phase lock indication signal comprises means for changing the phase lock indication signal to its first logic state when the digital count increases above a predetermined threshold and means for changing the phase lock indication signal to its second logic state when the digital count decreases below the predetermined threshold.

6. The phase lock detention circuit according to claim 5, further comprising means for receiving the predetermined threshold.

7. A phase lock detection circuit, comprising:
  a phase detection circuit that produces a phase detect signal having one of a first logic state or a second logic state responsive to a first input signal and a second input signal applied thereto;
  a stabilized phase lock indication circuit, electrically coupled to said phase detection circuit, that produces a phase lock indication signal having one of a first logic state or a second logic state, the phase lock indication signal changing to a respective one of its first and second logic states in response to the phase detect signal remaining in a respective one of its first and second logic states for a predetermined time interval, said stabilized phase lock indication circuit including:
    means for controlling a digital count responsive to the phase detect signal; and
    means for changing the phase lock indication signal to its first logic state when the digital count meets a first predetermined criterion and for changing the phase lock indication signal to its second logic state when the digital count meets a second predetermined criterion,
  wherein said stabilized phase lock indication circuit is configured to receive the second input signal, and wherein said means for controlling a digital count comprises means for increasing or decreasing the digital count responsive to a transition of the second input signal.

8. A phase lock detection circuit, comprising:
  a phase detection circuit that produces a phase detect signal having one of a first logic state or a second logic state responsive to a first input signal and a second input signal applied thereto;
  a stabilized phase lock indication circuit, electrically coupled to said phase detection circuit, that produces a phase lock indication signal having one of a first logic state or a second logic state, the phase lock indication signal changing to a respective one of its first and second logic states in response to the phase detect signal remaining in a respective one of its first and second logic states for a predetermined time interval, said stabilized phase lock indication circuit including:
    means for controlling a digital count responsive to the phase detect signal; and
    means for changing the phase lock indication signal to its first logic state when the digital count meets a first predetermined criterion and for changing the phase lock indication signal to its second logic state when the digital count meets a second predetermined criterion,
  wherein said stabilized phase lock indication circuit is configured to receive a reset signal, and wherein said means for controlling a digital count comprises means for resetting the digital count to a predetermined value responsive to the reset signal.

9. The phase lock detection circuit according to claim 3, wherein said stabilized phase lock indication circuit comprises:
  a capacitor;
  means for controlling a capacitor voltage across said capacitor responsive to the phase detect signal; and
  means for changing the phase lock indication signal to its first logic state when the capacitor voltage meets a first predetermined criterion and for changing the phase lock indication signal to its second logic state when the capacitor voltage meets a second predetermined criterion.

10. The phase lock detection circuit according to claim 9, wherein said means for controlling a capacitor voltage comprises means for charging said capacitor to increase the capacitor voltage when the phase detect signal is in its first logic state and for discharging said capacitor to decrease the capacitor voltage when the phase detect signal is in its second logic state.

11. The phase lock detection circuit according to claim 9, wherein said means for changing the phase lock indication signal comprises means for changing the phase lock indication signal to its first logic state when the capacitor voltage rises above a first predetermined threshold and for changing the phase lock indication signal to its second logic state when the capacitor voltage falls below a second predetermined threshold.

12. A phase lock detection circuit, comprising:
  a phase detection circuit that produces a phase detect signal having one of a first logic state or a second logic state responsive to a first input signal and a second input signal applied thereto;
  a stabilized phase lock indication circuit, electrically coupled to said phase detection circuit, that produces a phase lock indication signal having one of a first logic state or a second logic state, the phase lock indication signal changing to a respective one of its first and second logic states in response to the phase detect signal remaining in a respective one of its first and second logic states for a predetermined time interval, said stabilized phase lock indication circuit comprising:
    a capacitor having a first terminal and a second terminal, said second terminal of said capacitor tied to a ground signal;
    means for controlling a capacitor voltage across said capacitor responsive to the phase detect signal, said means for controlling a capacitor voltage including means for charging said capacitor to increase the capacitor voltage when the phase detect signal is in its first logic state and for discharging said capacitor to decrease the capacitor voltage when the phase detect signal is in its second logic state, said means for charging and discharging said capacitor comprising:
      a first multiplexer configured to receive the ground signal and the phase detect signal and operative to provide one of the ground signal or the phase detect signal at a first multiplexer output responsive to the phase lock indication signal, said first multiplexer providing the phase detect signal at said first multiplexer output when the phase lock indication signal is in its first logic state and said first multiplexer providing the ground signal at said first multiplexer output when the phase lock indication signal is in its second logic state;

a second multiplexer configured to receive the ground signal and the phase detect signal and operative to provide one of the ground signal or the phase detect signal at a second multiplexer output responsive to the phase lock indication signal, said second multiplexer providing the phase detect signal at said second multiplexer output when the phase lock indication signal is in its second logic state and said second multiplexer providing the ground signal at said second multiplexer output when the phase lock indication signal is in its first logic state;

a current source connected to said first terminal of said capacitor;

a first switch connected to said first terminal of said capacitor and having one of an open state or a closed state responsive to a signal provided at said first multiplexer output, said first switch applying said ground signal to said first terminal of said capacitor in said closed state when the signal provided at said first multiplexer output has a first logic state and said first switch applying a high impedance to at said first terminal of said capacitor in said open state when the signal provided at said first multiplexer output has a second logic state; and a second switch connected to said first terminal of said capacitor and having one of an open state or a closed state responsive to a signal provided at said second multiplexer output, said second switch applying said ground signal to said first terminal of said capacitor in said closed state when the signal provided at said second multiplexer output has a first logic state and said second switch applying a high impedance to at said first terminal of said capacitor in said open state when the signal provided at said second multiplexer output has a second logic state; and means for changing the phase lock indication signal to its first logic state when the capacitor voltage meets a first predetermined criterion and for changing the phase lock indication signal to its second logic state when the capacitor voltage meets a second predetermined criterion.

13. The phase lock detection circuit according to claim 12, wherein said first switch and said second switch discharge said capacitor at respective different rates when in their closed states.

14. The phase lock detection circuit according to claim 12, wherein said means for changing the phase lock indication signal comprises:

a threshold detection circuit that produces a logic signal that transitions to a first logic state when said capacitor voltage increases past a first voltage threshold and that transitions to a second logic state when the capacitor voltage decreases below a second voltage threshold; and a latching circuit that latches the phase lock indication signal into its first logic state when the logic signal transitions from its second logic state to its first logic state and that latches the phase lock indication signal into its second logic state when the logic signal transitions from its first logic state to its second logic state.

15. A phase lock detection method, comprising the steps of:

producing a phase detect signal having one of a first logic state or a second logic state responsive to a first input signal and a second input signal, wherein said step of producing a phase detect signal includes the steps of:

producing a delayed first input signal from the first input signal;

producing a window signal representing a logic AND'ing of the first input signal and the delayed first input signal;

producing a delayed second input signal from the second input signal; and producing a phase detect signal from the window signal and the delayed second input signal, the phase detect signal having a logic state corresponding to the logic state of the window signal at a transition of the delayed second input signal; and producing a phase lock indication signal having one of a first logic state or a second logic state, the phase lock indication signal changing to a respective one of its first and second logic states in response to the phase detect signal remaining in a respective one of its first and second logic states for a predetermined time interval.

16. The method according to claim 15, wherein said step of producing a delayed first input signal comprises the step of producing a delayed first input signal that is delayed by a first delay with respect to the first input signal, and wherein said step of producing a delayed second input signal comprises the step of producing a delayed second input signal that is delayed by half of the first delay with respect to said second input signal.

17. A phase lock detection method, comprising the steps of:

producing a phase detect signal having one of a first logic state or a second logic state responsive to a first input signal and a second input signal, wherein the phase detect signal transitions from the second logic state to the first logic state upon a first logic transition of the first input signal occurring within a predetermined interval with respect to a first logic transition of the second input signal and wherein the phase detect signal transitions from the first logic state back to the second logic state upon a second logic transition of the first input signal failing to occur within the predetermined interval with respect to a second logic transition of the second input signal; and producing a phase lock indication signal having one of a first logic state or a second logic state, the phase lock indication signal changing to a respective one of its first and second logic states in response to the phase detect signal remaining in a respective one of its first and second logic states for a predetermined time interval, wherein said step of producing a phase lock indication signal comprises the steps of:

increasing a value when said phase detect signal is in its first logic state;

decreasing the value when said phase detect signal is in its second logic state;

changing the phase lock indication signal to its first logic state when the value meets a first predetermined criterion; and changing the phase lock indication signal to its second logic state when the value meets a second predetermined criterion.

18. The method according to claim 17, wherein said step of producing a phase lock indication signal comprises the steps of:

controlling a capacitor voltage across a capacitor responsive to the phase detect signal;

changing the phase lock indication signal to its first logic state when the capacitor voltage meets a first predetermined criterion; and changing the phase lock indication signal to its second logic state when the capacitor voltage meets a second predetermined criterion.

19. The phase lock detection circuit according to claim 3, wherein said stabilized phase lock indication circuit comprises:
   means for controlling a digital count responsive to the phase detect signal; and
   means for changing the phase lock indication signal to its first logic state when the digital count meets a first predetermined criterion and for changing the phase lock indication signal to its second logic state when the digital count meets a second predetermined criterion.

20. The phase lock detection circuit according to claim 19, wherein said means for controlling a digital count comprises means for increasing the digital count when the phase detect signal is in its first logic state and for decreasing the digital count when the phase detect signal is in its second logic state.

21. The phase lock detection circuit according to claim 19, wherein said means for changing the phase lock indication signal comprises means for changing the phase lock indication signal to its first logic state when the digital count increases above a predetermined threshold and means for changing the phase lock indication signal to its second logic state when the digital count decreases below the predetermined threshold.

22. The phase lock detection circuit according to claim 21, further comprising means for receiving the predetermined threshold.

23. The phase lock detection circuit according to claim 19, wherein said stabilized phase lock indication circuit is configured to receive the second input signal, and wherein said means for controlling a digital count comprises means for increasing or decreasing the digital count responsive to a transition of the second input signal.

24. The phase lock detection circuit according to claim 19, wherein said stabilized phase lock indication circuit is configured to receive a reset signal, and wherein said means for controlling a digital count comprises means for resetting the digital count to a predetermined value responsive to the reset signal.

25. The phase lock detection circuit according to claim 10, wherein said capacitor has a first terminal and a second terminal, wherein said second terminal of said capacitor is tied to a ground signal, and wherein said means for charging and discharging said capacitor comprises:
   a first multiplexer configured to receive the ground signal and the phase detect signal and operative to provide one of the ground signal or the phase detect signal at a first multiplexer output responsive to the phase lock indication signal, said first multiplexer providing the phase detect signal at said first multiplexer output when the phase lock indication signal is in its first logic state and said first multiplexer providing the ground signal at said first multiplexer output when the phase lock indication signal is in its second logic state;
   a second multiplexer configured to receive the ground signal and the phase detect signal and operative to provide one of the ground signal or the phase detect signal at a second multiplexer output responsive to the phase lock indication signal, said second multiplexer providing the phase detect signal at said second multiplexer output when the phase lock indication signal is in its second logic state and said second multiplexer providing the ground signal at said second multiplexer output when the phase lock indication signal is in its first logic state;
   a current source connected to said first terminal of said capacitor;
   a first switch connected to said first terminal of said capacitor and having one of an open state or a closed state responsive to a signal provided at said first multiplexer output, said first switch applying said ground signal to said first terminal of said capacitor in said closed state when the signal provided at said first multiplexer output has a first logic state and said first switch applying a high impedance to at said first terminal of said capacitor in said open state when the signal provided at said first multiplexer output has a second logic state;
   a second switch connected to said first terminal of said capacitor and having one of an open state or a closed state responsive to a signal provided at said second multiplexer output, said second switch applying said ground signal to said first terminal of said capacitor in said closed state when the signal provided at said second multiplexer output has a first logic state and said second switch applying a high impedance to at said first terminal of said capacitor in said open state when the signal provided at said second multiplexer output has a second logic state.

26. The phase lock detection circuit according to claim 25, wherein said first switch and said second switch discharge said capacitor at respective different rates when in their closed states.

27. The phase lock detection circuit according to claim 9, wherein said means for changing the phase lock indication signal comprises:
   a threshold detection circuit that produces a logic signal that transitions to a first logic state when said capacitor voltage increases past a first voltage threshold and that transitions to a second logic state when the capacitor voltage decreases below a second voltage threshold; and
   a latching circuit that latches the phase lock indication signal into its first logic state when the logic signal transitions from its second logic state to its first logic state and that latches the phase lock indication signal into its second logic state when the logic signal transitions from its first logic state to its second logic state.

28. The method according to claim 17, wherein said step of producing a phase lock indication signal comprises the steps of:
   controlling a digital count responsive to the phase detect signal;
   changing the phase lock indication signal to its first logic state when the digital count meets a first predetermined criterion; and
   changing the phase lock indication signal to its second logic state when the digital count meets a second predetermined criterion.

* * * * *

UNITED STATES PATENT AND TRADEMARK OFFICE
CERTIFICATE OF CORRECTION

PATENT NO.    : 6,177,842 B1                                    Page 1 of 1
DATED         : January 23, 2001
INVENTOR(S)   : Tae-won Ahn et al.

It is certified that error appears in the above-identified patent and that said Letters Patent is hereby corrected as shown below:

Column 9,
Line 19, please change "detention" to -- detection --.

Signed and Sealed this

Second Day of September, 2003

JAMES E. ROGAN
*Director of the United States Patent and Trademark Office*